(12) United States Patent
Lee et al.

(10) Patent No.: US 11,646,180 B2
(45) Date of Patent: May 9, 2023

(54) DEPOSITING APPARATUS

(71) Applicant: SAMSUNG DISPLAY CO., LTD., Yongin-si (KR)

(72) Inventors: Kwanyong Lee, Pyeongtaek-si (KR); Sangmok Nam, Seongnam-si (KR); Hyun-Woo Kim, Cheonan-si (KR); Jaeho Byeon, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 297 days.

(21) Appl. No.: 16/856,160

(22) Filed: Apr. 23, 2020

(65) Prior Publication Data
US 2021/0020417 A1  Jan. 21, 2021

(30) Foreign Application Priority Data
Jul. 18, 2019  (KR) .......................... 10-2019-0087246

(51) Int. Cl.
*H01J 37/34* (2006.01)
*H01J 37/32* (2006.01)
*C23C 14/35* (2006.01)

(52) U.S. Cl.
CPC ........ *H01J 37/32669* (2013.01); *C23C 14/35* (2013.01); *H01J 37/3408* (2013.01); *H01J 37/3455* (2013.01); *H01J 37/3461* (2013.01)

(58) Field of Classification Search
None
See application file for complete search history.

(56) References Cited

U.S. PATENT DOCUMENTS

| | | | | |
|---|---|---|---|---|
| 5,458,759 A | * | 10/1995 | Hosokawa | H01J 37/3408 204/298.23 |
| 6,432,285 B1 | * | 8/2002 | Kastanis | H01J 37/347 204/298.19 |
| 2010/0294656 A1 | * | 11/2010 | Ikeda | H01J 37/3266 204/298.11 |

(Continued)

FOREIGN PATENT DOCUMENTS

| | | |
|---|---|---|
| JP | 2617439 | 3/1997 |
| JP | 3720101 | 11/2005 |
| KR | 10-2000-0057071 | 9/2000 |

(Continued)

*Primary Examiner* — Jason Berman
(74) *Attorney, Agent, or Firm* — F. Chau & Associates, LLC (57) ABSTRACT

A deposition apparatus, including: a substrate supporter, wherein a substrate is fixed to the substrate supporter; a target facing the substrate; a first magnet assembly disposed below the target and including a first magnet extending in a first direction and having a first length, and a second magnet at least partially surrounding the first magnet; and a second magnet assembly disposed below the target and spaced apart from the first magnet assembly in a second direction which is substantially perpendicular to the first direction, and including a first magnet extending in the first direction and having a second length greater than the first length, and a second magnet at least partially surrounding the first magnet, and wherein the second magnet of the first magnet assembly and the second magnet of the second magnet assembly have substantially the same length as each other in the first direction.

17 Claims, 10 Drawing Sheets

(56) References Cited

U.S. PATENT DOCUMENTS

2013/0146444 A1* 6/2013 Chetcuti ................. C23C 14/35
204/298.16

FOREIGN PATENT DOCUMENTS

| KR | 10-2001-0002579 | 1/2001 |
| KR | 10-1165432 | 7/2012 |
| KR | 10-1744759 | 6/2017 |
| KR | 10-2019-0005628 | 1/2019 |

* cited by examiner

DEPOSITING APPARATUS

CROSS-REFERENCE TO RELATED APPLICATION

This application claims priority under 35 U.S.C. § 119 to Korean Patent Application No. 10-2019-0087246, filed on Jul. 18, 2019, the disclosure of which is incorporated by reference herein in its entirety.

TECHNICAL FIELD

Exemplary embodiments of the present inventive concept relate to a depositing apparatus. More particularly, exemplary embodiments of the present inventive concept relate to a depositing apparatus including a plurality of magnet assemblies.

DISCUSSION OF THE RELATED ART

Currently, a display apparatus having a relatively light weight and a relatively small size has been under development. A cathode ray tube (CRT) display apparatus has been used due to performance and a competitive price. However, the CRT display apparatus is relatively large. Therefore, a display apparatus such as a plasma display apparatus, a liquid crystal display apparatus and an organic light emitting display apparatus have been increasingly used due to their relatively small size, light weight and low-power-consumption.

In manufacturing the display apparatus, a deposition apparatus having a target may be used. In some cases, the target, which is a source of deposition material, may be unevenly eroded.

SUMMARY

According to an exemplary embodiment of the present inventive concept, a deposition apparatus, including: a substrate supporter, wherein a substrate is fixed to the substrate supporter; a target facing the substrate; a first magnet assembly disposed below the target and including a first magnet extending in a first direction and having a first length, and a second magnet at least partially surrounding the first magnet; and a second magnet assembly disposed below the target and spaced apart from the first magnet assembly in a second direction which is substantially perpendicular to the first direction, and including a first magnet extending in the first direction and having a second length greater than the first length, and a second magnet at least partially surrounding the first magnet, and wherein the second magnet of the first magnet assembly and the second magnet of the second magnet assembly have substantially the same length as each other in the first direction.

In an exemplary embodiment of the present inventive concept, the first and second magnet assemblies reciprocate along the second direction.

In an exemplary embodiment of the present inventive concept, the second magnet of the first magnet assembly and the second magnet of the second magnet assembly each have a rectangular shape.

In an exemplary embodiment of the present inventive concept, the first and second magnets of the first and second magnet assemblies each include a plurality of magnet blocks.

In an exemplary embodiment of the present inventive concept, a number of magnet blocks of the first magnet of the second magnet assembly is greater than a number of magnet blocks of the first magnet of the first magnet assembly.

In an exemplary embodiment of the present inventive concept, the deposition apparatus further includes: a third magnet assembly spaced apart from the second magnet assembly in the second direction, and including a first magnet extending in the first direction, and a second magnet at least partially surrounding the first magnet, wherein the second magnet of the first magnet assembly and the second magnet of the third magnet assembly have substantially the same length in the first direction.

In an exemplary embodiment of the present inventive concept, the first magnet of the third magnet assembly has a third length greater than the first length and smaller than the second length.

In an exemplary embodiment of the present inventive concept, the deposition apparatus further includes: a plurality of magnet assemblies spaced apart from the second magnet assembly in the second direction, wherein each of the magnet assemblies includes a first magnet and a second magnet at least partially surrounding the first magnet, wherein the plurality of magnet assemblies includes the first magnet assembly and the second magnet assembly, and wherein an arrangement of the magnet assemblies is symmetrical with respect to a line extending in the second direction.

In an exemplary embodiment of the present inventive concept, a number of the magnet assemblies is odd. Lengths in the first direction of the second magnets of the magnet assemblies are all the same as one another, and lengths of the first magnets of two adjacent magnet assemblies are different from each other.

In an exemplary embodiment of the present inventive concept, the deposition apparatus, further includes a shunt disposed between a portion of the second magnet assembly and the target, and including a ferromagnetic material.

In an exemplary embodiment of the present inventive concept, the shunt is arranged to overlap an edge of the substrate.

In an exemplary embodiment of the present inventive concept, the deposition apparatus further includes: a chamber to accommodate the substrate supporter and the target; a vacuum generator to provide a vacuum to the chamber; and a gas generator to provide a process gas into the chamber.

In an exemplary embodiment of the present inventive concept, the deposition apparatus further includes: a backing plate to fix the target; a cavity plate disposed below the backing plate to fix the backing plate and fixed to the chamber; and a non-stick layer disposed between the cavity plate and the backing plate.

In an exemplary embodiment of the present inventive concept, a portion of the first magnet assembly is disposed to not overlap the substrate.

According to an exemplary embodiment of the present inventive concept, a deposition apparatus includes: a substrate supporter, wherein a substrate is fixed to the substrate supporter; a target facing the substrate; a first magnet assembly disposed below the target and including a first magnet extending in a first direction and having a first length, and a second magnet at least partially surrounding the first magnet; and a second magnet assembly disposed below the target and spaced apart from the first magnet assembly in a second direction which is substantially perpendicular to the first direction, and including a first magnet extending in the first direction and having a second length greater than the first length, and a second magnet at least partially surrounding the first magnet, wherein a length of the second magnet of the first magnet assembly in the first direction is smaller than a length of the second magnet of the second magnet assembly, and a portion of the first magnet assembly does not overlap the substrate.

In an exemplary embodiment of the present inventive concept, the deposition apparatus further includes: a third magnet assembly spaced apart from the second magnet assembly in the second direction, and including a first magnet extending in the first direction, and a second magnet at least partially surrounding the first magnet, wherein the second magnet of the first magnet assembly and the second magnet of the third magnet assembly have substantially the same length as each other in the first direction.

According to an exemplary embodiment of the present inventive concept, a deposition apparatus includes: a substrate supporter, wherein a substrate is fixed to the substrate supporter; a target facing the substrate; and a plurality of magnet assemblies disposed under the target, wherein each of the plurality of magnet assemblies includes a first magnet extending in a first direction, and a second magnet at least partially surrounding the first magnet, wherein the second magnets of the plurality of magnet assemblies have substantially the same length as each other in the first direction, and the first magnets of at least two of the magnet assemblies have different lengths from each other.

In an exemplary embodiment of the present inventive concept, an arrangement of the magnet assemblies is symmetrical with respect to a line extending in a second direction that is substantially perpendicular to the first direction.

In an exemplary embodiment of the present inventive concept, lengths of the first magnets of two immediately adjacent magnet assemblies are different from each other.

According to an exemplary embodiment of the present inventive concept, a deposition apparatus includes: a substrate supporter; a substrate disposed on the substrate supporter; a target facing the substrate; and a plurality of magnet assemblies disposed below the target, and including a first magnet assembly, a second magnet assembly, and a third magnet assembly, wherein each of the plurality of magnet assemblies includes a first magnet extending in a first direction and a second magnet at least partially surrounding the first magnet, and wherein a length of the first magnet of the second magnet assembly is different from a length of the first magnet of the first magnet assembly and a length of the first magnet of the third magnet assembly.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be explained in detail with reference to the accompanying drawings.

Figure 1:
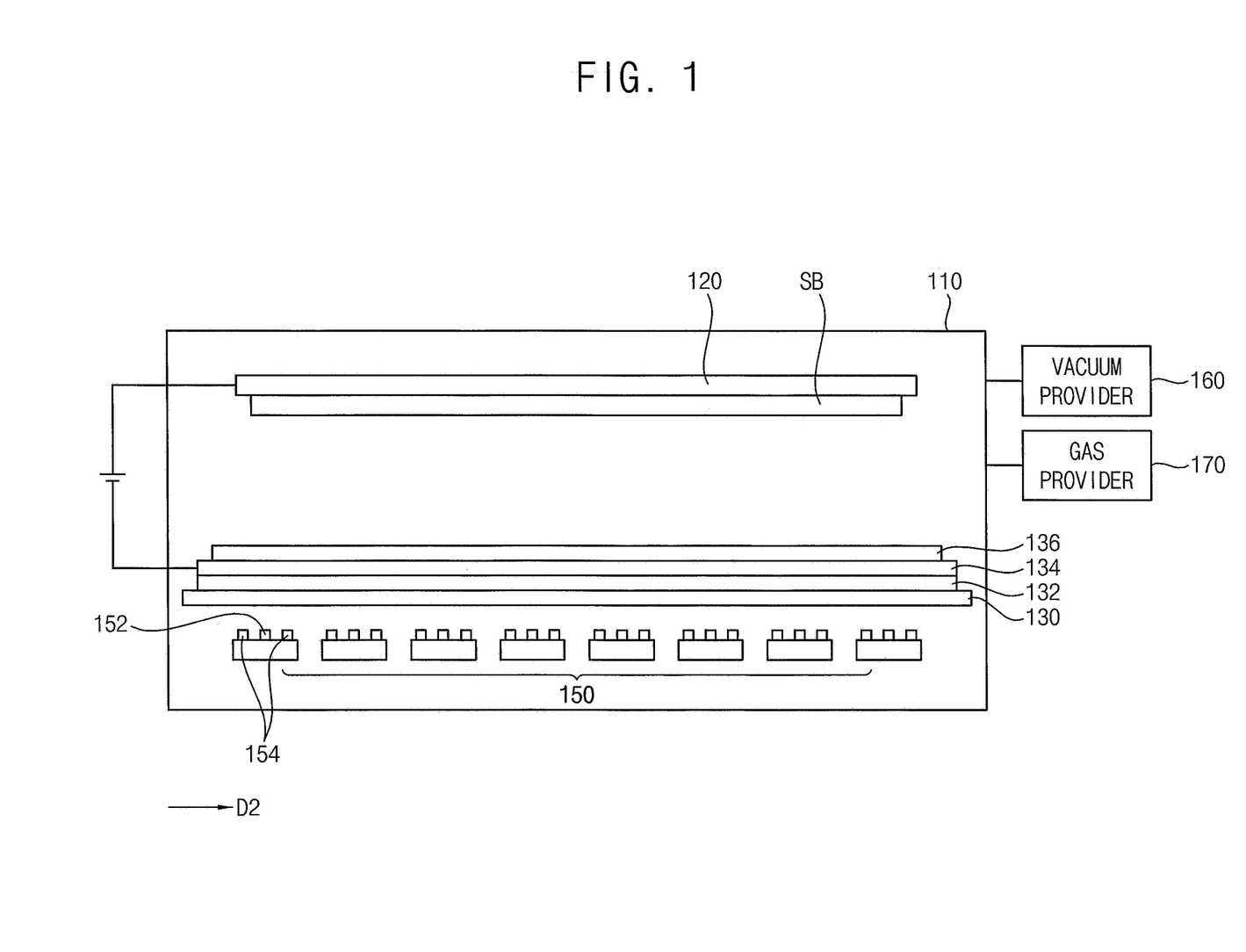
FIG. 1 is a schematic side view illustrating a depositing apparatus according to an exemplary embodiment of the present inventive concept.

FIG. 1 is a schematic side view illustrating a depositing apparatus according to an exemplary embodiment of the present inventive concept.

Referring to FIG. 1, the deposition apparatus may include a chamber 110, a substrate supporter 120, a cavity plate 130, a non-stick layer 132, a backing plate 134, a target 136, and a plurality of magnet assemblies 150, a vacuum provider 160, and a gas provider 170.

The chamber 110 may be maintained in a high vacuum state. The chamber 110 is a space for sputtering to deposit a thin film on the substrate SB. The substrate supporter 120 supporting the substrate SB may be disposed at one inner side of the chamber 110. A target 136, which is a deposition material, and magnet assemblies 150 that generate a magnetic field may be disposed at the other side (e.g., an opposing side) of the chamber 110. For example, the chamber 110 may accommodate the substrate supporter 120 and the target 136 for supporting the substrate SB.

In addition, the vacuum provider 160, which maintains the vacuum in the interior of the chamber 110, and the gas provider 170, which supplies a process gas to the chamber 110, may be connected to outside of the chamber 110. For example, the vacuum provider 160 may be a vacuum generator or a vacuum pump. The gas provider 170 may be, for example, a gas generator.

The substrate supporter 120 may bring the substrate SB into or out of the chamber 110. In addition, the substrate supporter 120 may fix the substrate SB during the deposition of the deposition material on the substrate SB.

One surface of the substrate SB is coupled to the substrate supporter 120, and the other surface thereof faces the target 136. For example, the substrate SB may be a glass substrate constituting a flat panel display apparatus such as a liquid crystal display apparatus, a plasma display apparatus, and an organic light-emitting diode apparatus.

The cavity plate 130 may be located between the backing plate 134 and the chamber 110. For example, the cavity plate 130 may be disposed on a lower surface of the backing plate 134. The cavity plate 130 fixes the backing plate 134. For example, the cavity plate 130 fixes the backing plate 134 to the chamber 110. In addition, the cavity plate 130 may be installed to be fixed to the chamber 110.

The non-stick layer 132 may be located between the cavity plate 130 and the backing plate 134. The non-stick layer 132 may include, for example, Polytetrafluoroethylene (PTFE). In addition, the non-stick layer 132 may be referred to as a TEFLON layer 132.

The backing plate 134 fixes the target 136. For example, the backing plate 134 may fix the target 136 to the chamber 110. In addition, a coolant may flow inside the backing plate 134, thereby limiting a temperature rise of the target 136. In addition, the backing plate 134 may receive power from a power supply unit and supply the received power to the target 136. The target 136 supplied with power from the power supply unit may be driven by a cathode to form a plasma.

The target 136 is a deposition material to be deposited on the substrate SB. Here, the deposition material includes various materials that can be deposited on the substrate SB. For example, the deposition material may include molybdenum (Mo), aluminum (Al), titanium (Ti), silver (Ag), copper (Cu), Materials such as indium tin oxide (ITO), indium zinc oxide (IZO), indium gallium zinc oxide (GZO), molybdenum nitride (MoN), and the like.

The plurality of magnet assemblies ISO may be disposed on a bottom surface of the cavity plate 130. The magnet assemblies 150 are arranged along a second direction D2 and form a magnetic field to constrain a movement of ions, generated by the plasma, around the target 136 and to extend a movement path of the ions to increase sputtering efficiency. The magnet assemblies 150 may be scan driven to reciprocate along the second direction D2.

The magnet assemblies 150 will be described later in detail with reference to FIG. 2.

The vacuum provider 160 may be connected to the chamber 110 to provide a vacuum to the chamber 110.

The gas provider 170 may be connected to the chamber 110 to provide a process gas to the chamber 110. The process gases may include inert gases such as argon and/or reactive gases including oxygen, nitrogen, hydrogen, ammonia, ozone and the like.

Figure 2:
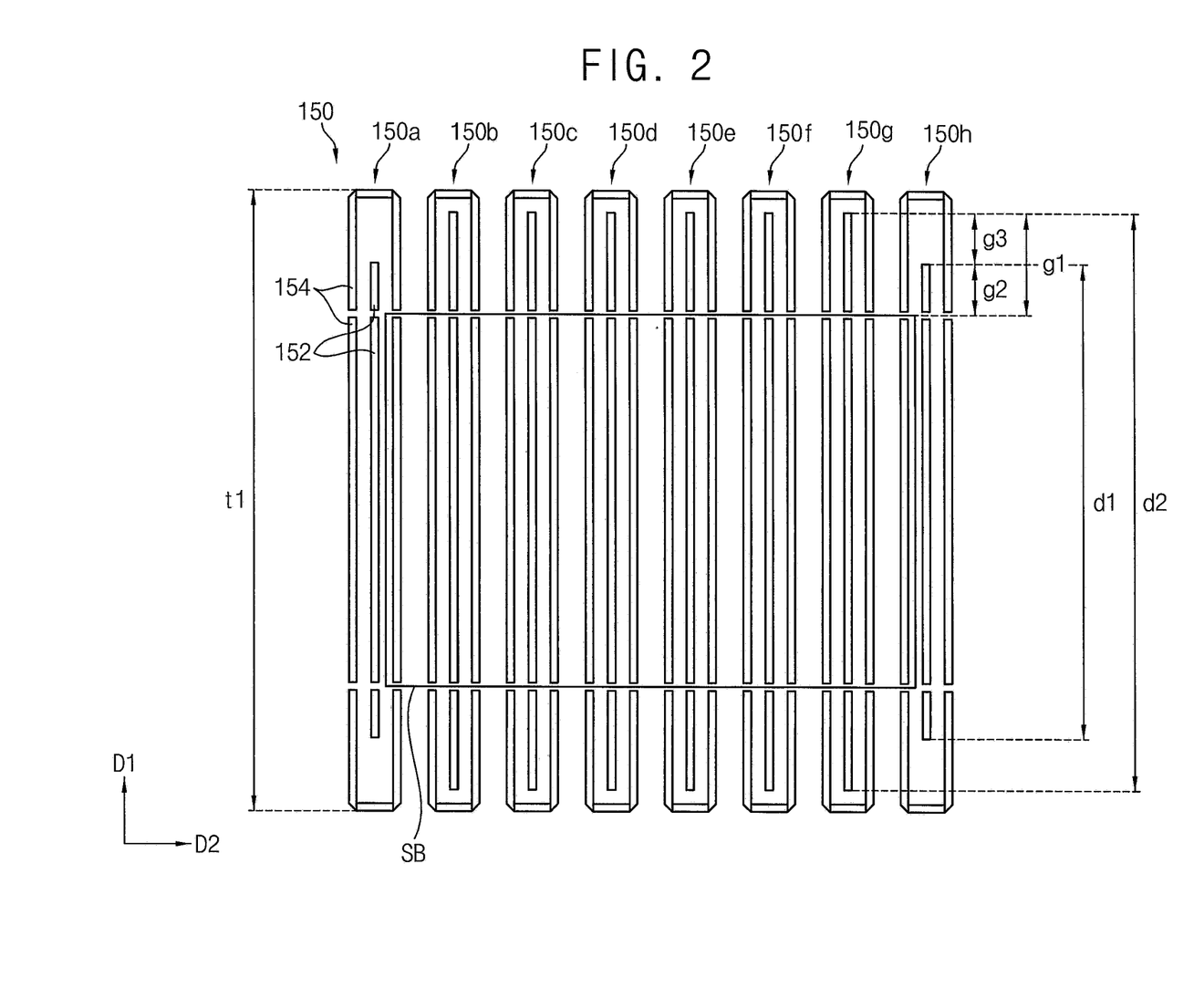
FIG. 2 is a plan view illustrating a magnet assembly of the depositing apparatus of FIG. 1.

FIG. 2 is a plan view illustrating a magnet assembly of the depositing apparatus of FIG. 1.

Referring to FIGS. 1 and 2, the magnet assemblies 150 may include a first magnet assembly 150a, a second magnet assembly 150b, a third magnet assembly 150c, a fourth magnet assembly 150d, a fifth magnet assembly 150e, a sixth magnet assembly 150f, a seventh magnet assembly 150g, and the eighth magnet assembly 150h.

The first magnet assembly 150a, the second magnet assembly 150b, the third magnet assembly 150c, the fourth magnet assembly 150d, the fifth magnet assembly 150e, and the sixth magnet assembly 150f, the seventh magnet assembly 150g, and the eighth magnet assembly 150h may be arranged in the second direction D2.

The first magnet assembly 150a may include a first magnet 152 extending in a first direction D1, substantially perpendicular to the second direction D2, and having a first length d1, and the second magnet 154 at least partially surrounds the first magnet 152.

The second magnet assembly 150b may be spaced apart from the first magnet assembly 150a in the second direction D2 substantially perpendicular to the first direction D1. In addition, the second magnet assembly 150b may be spaced apart from the first magnet assembly 150a in the first direction D1. The second magnet assembly 150b may include a first magnet which extends in the first direction D1 and has a second length d2 greater than the first length d1, and a second magnet disposed to surround the first magnet. For example, an end of the first magnet 152 of the first magnet assembly 150a and an end of the first magnet of the second magnet assembly 150b may be spaced apart from each other by a third distance g3 in the first direction D1. For example, the end of the first magnet of the second magnet assembly 150b extends beyond the end of the first magnet 152 of the first magnet assembly 150a by the third distance g3 in the first direction D1.

The second magnet 154 of the first magnet assembly 150a and the second magnet of the second magnet assembly 150b may have same length a in the first direction. (t1 in figure)

The third magnet assembly 150c, the fourth magnet assembly 150d, the fifth magnet assembly 150e, the sixth magnet assembly 150f, and the seventh magnet assembly 150g may have substantially the same configuration as the second magnet assembly 150b. The eighth magnet assembly 150h may have substantially the same configuration as the first magnet assembly 150a. For example, the magnet assemblies 150 may be symmetrically arranged in a plan view with respect to an imaginary line extending in the first direction D1 between the fourth magnet assembly 150d and the fifth magnet assembly 150e.

The substrate SB may be disposed to overlap the magnet assemblies 150. An edge, of the substrate SB, extending in the second direction D2, e.g., a horizontal side of the substrate SB, is located inward of an end of the first magnet 152 of the second to seventh magnet assemblies 150b-150g. As a result, a first gap g1 (e.g., a distance) may be provided between the horizontal side of the substrate SB and the end of the first magnet 152 of the second to seventh magnet assemblies 150b-150g. In addition, the horizontal side of the substrate SB may be located inward of the end of the first magnet 152 of the first and eighth magnet assemblies 150a-150h. As a result, a second gap g2, smaller than the first gap g1, may be provided between the horizontal side of the substrate SB and the end of the first magnet 152 of the first and eighth magnet assemblies 150a-150h.

According to the present embodiment, the deposition apparatus includes a substrate supporter for fixing a substrate, a target facing the substrate, and a plurality of magnet assemblies disposed below the target and each of which includes a first magnet extending in a first direction and a second magnet at least partially surrounding the first magnet. The second magnets of the plurality of magnet assemblies have the same length in the first direction, and the first magnets of the at least two magnet assemblies are formed to have different lengths. Therefore, non-uniform erosion of the target due to overlap of the plasma racetrack formed by the magnet assemblies at the edge of the substrate can be minimized. Accordingly, the efficiency of the target can be increased, and the process efficiency of the deposition process can be increased.

Figure 3:
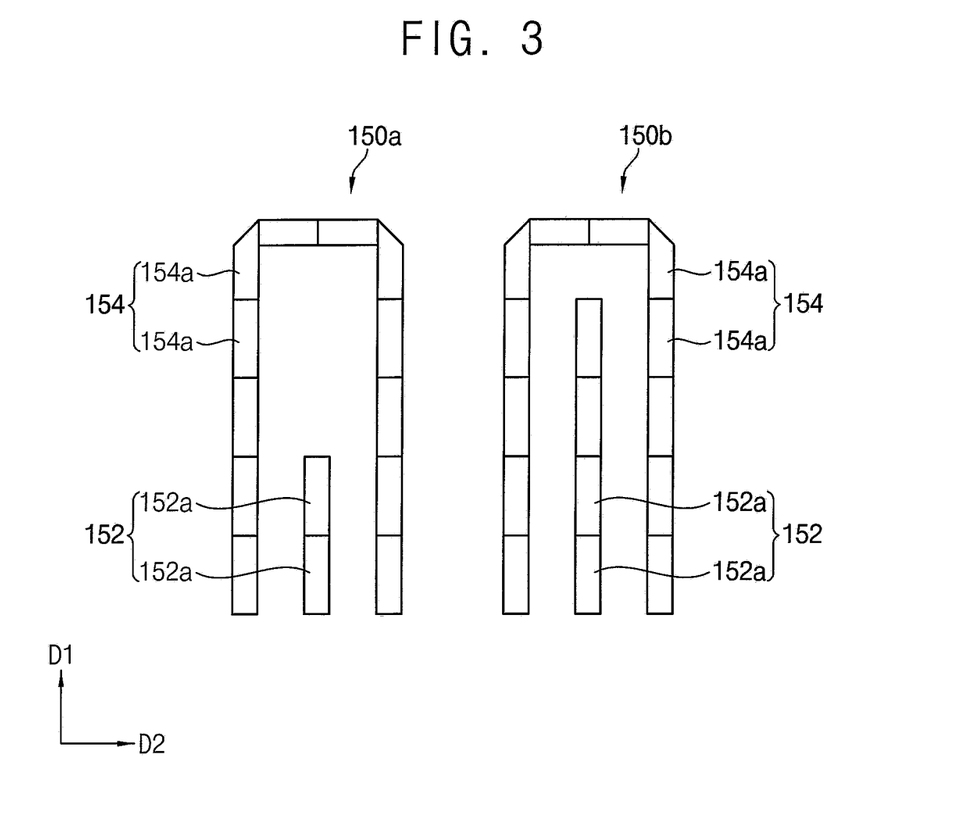
FIG. 3 is a partial enlarged view illustrating first and second magnet assemblies of FIG. 2.

FIG. 3 is a partial enlarged view illustrating first and second magnet assemblies of FIG. 2.

Referring to FIGS. 2 and 3, the first and second magnets 152 and 154 of the first magnet assembly 150a and the second magnet assembly 150b may include a plurality of magnet blocks, respectively. In this case, the number of magnet blocks constituting the first magnet 152 of the first magnet assembly 150a and the number of magnet blocks constituting the first magnet 152 of the second magnet assembly 150b may be different.

Thus, the number of magnet blocks of the first magnet 152 of the second magnet assembly 150b may be greater than that of the magnet blocks of the first magnet 152 of the first magnet assembly 150a. Therefore, if desired, the length of the first magnet may be easily adjustable.

FIGS. 4A to 4D are views illustrating magnetic field simulation, plasma discharge, and prevention of plasma congestion at an edge portion according to a length of a first magnet of the magnet assembly.

Figure 4A:
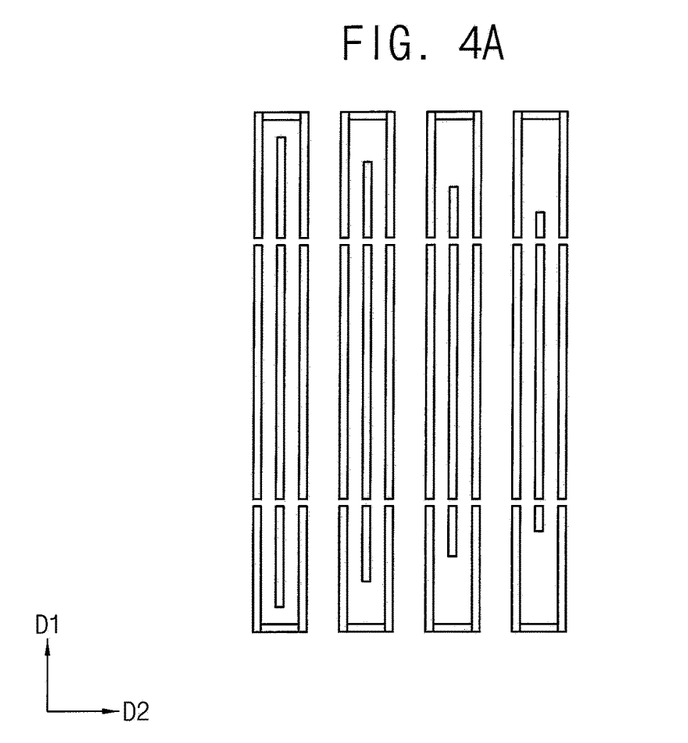
FIGS. 4A, 4B, 4C and 4D are views illustrating magnetic field simulation, plasma discharge, and prevention of plasma congestion at an edge portion according to a length of a first magnet of the magnet assembly.
Figure 4B:
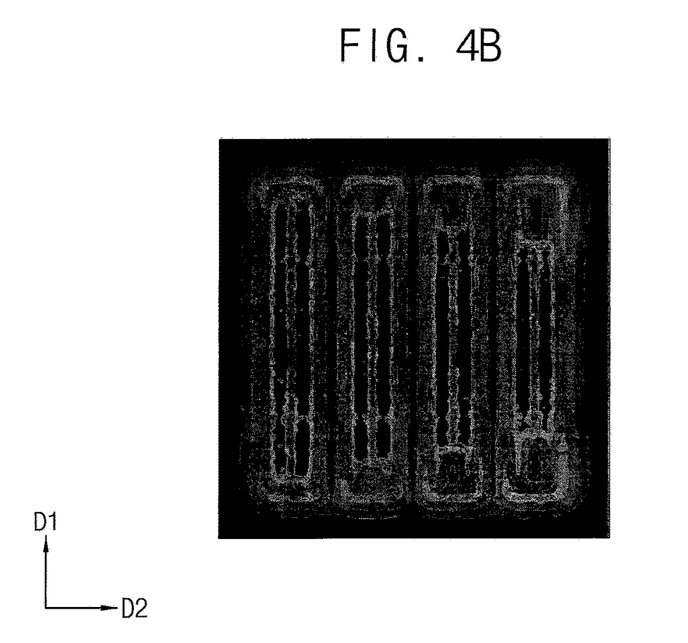
Figure 4C:
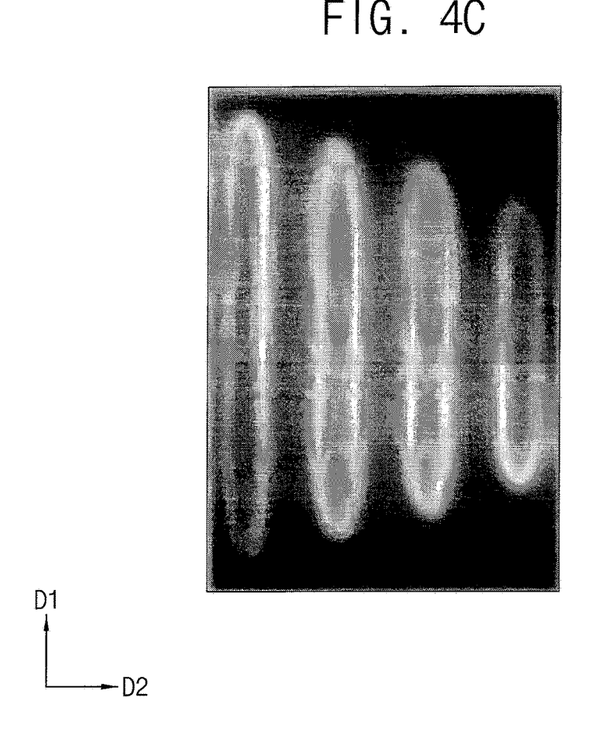
Figure 4D:
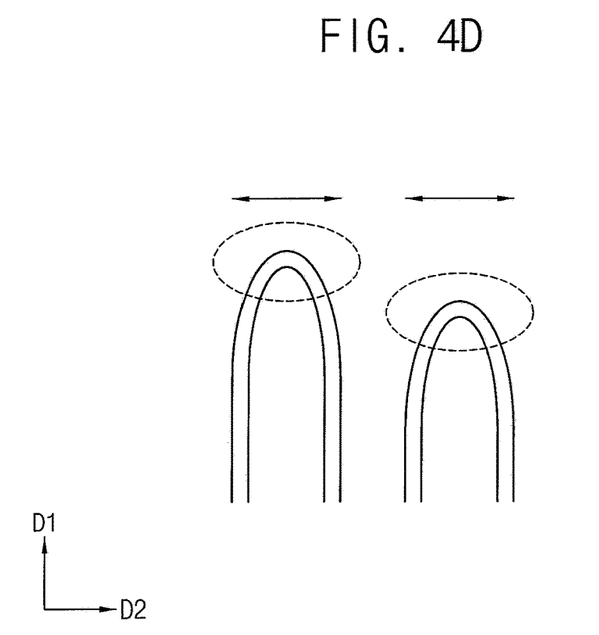

FIG. 4A shows four magnet assemblies which include first magnets with different lengths for simulation. FIG. 4B is a simulated image of a magnetic field generated by the magnet assemblies of FIG. 4A. FIG. 4C is an image of a plasma racetrack generated by the magnet assemblies of FIG. 4A. FIG. 4D is a diagram for describing degree of plasma density at edge portions of the magnet assemblies while driving the left and right scans.

Referring to FIGS. 4A to 4D, the magnet assemblies generate a magnetic field, whereby densities of electrons and plasma are generated. If local plasma congestion occurs in the target (see, e.g., 136 of FIG. 1), a phenomenon in which the target erosion by the plasma may also be locally generated, resulting in uneven erosion of the target.

To minimize local erosion, the magnet assemblies may be scanned from side to side as shown in FIG. 4D, but erosion imbalance may still occur at a portion where adjacent magnet assemblies overlap each other during the scan driving. This imbalance is due to a phenomenon that the plasma overlaps during the scan driving, and thus causes acceleration of local erosion.

According to an exemplary embodiment of the present inventive concept, since the length of the first magnet of two adjacent magnet assemblies (see, e.g., the difference in length between the first magnet 152 of the first magnet assembly 150a and the first magnet of the second magnet assembly 150b of FIG. 2) are different from each other, and by varying the length in the first direction D1 of the plasma racetrack generated for each magnet assembly, it is possible to minimize uneven erosion.

Thus, the second magnet collects electrons using a magnetic field generated by the first magnet and the second magnet. Leaving the length of the second magnet constant, and shortening the length of the first magnet, it is possible to adjust only the length of the plasma racetrack while keeping the electron collection similar.

Accordingly, erosion imbalance at the edge portion of the target (e.g., upper or lower side of the drawing) may be reduced.

Figure 5:
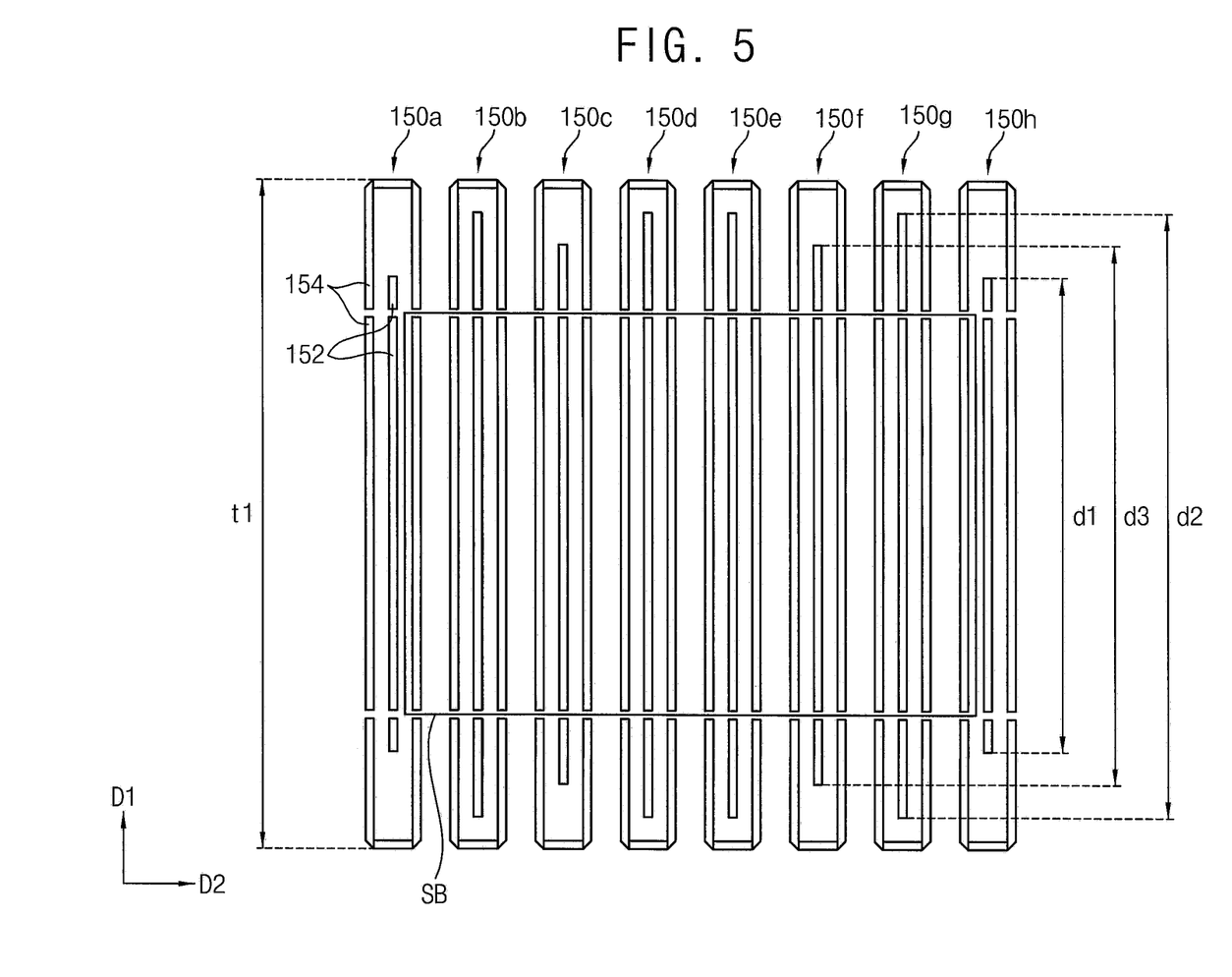
FIG. 5 is a plan view illustrating an arrangement of magnet assemblies according to an exemplary embodiment of the present inventive concept.

FIG. 5 is a plan view illustrating an arrangement of magnet assemblies according to an exemplary embodiment of the present inventive concept.

Referring to FIG. 5, the deposition apparatus is substantially the same as the deposition apparatus of FIGS. 1 to 3 except for lengths of first magnets of a third magnet assembly 150c and a sixth magnet assembly 150f. Therefore, repeated description may be omitted.

The third magnet assembly 150c may be spaced apart from the second magnet assembly 150b in the second direction D2. The third magnet assembly 150c may include a first magnet extending in the first direction D1 and a second magnet at least partially surrounding the first magnet. The first magnet of the third magnet assembly 150c may have a third length d3. The third length d3 may be greater than the first length d1 of the first magnet of the first magnet assembly 150a and smaller than the second length d2 of the first magnet of the second magnet assembly 150b. Accordingly, the lengths of the first magnets of two adjacent magnet assemblies of the magnet assemblies of the deposition apparatus may be different from each other. For example, if there are an even number of magnet assemblies in the deposition apparatus, then the middle two magnet assemblies may each include a first magnet with the same length as each other.

The magnet assemblies may be arranged symmetrically with respect to an imaginary line extending in the first direction D1 between the fourth magnet assembly 150d and the fifth magnet assembly 150e. For example, the eighth magnet assembly 150h may have a configuration substantially the same as that of the first magnet assembly 150a. The seventh magnet assembly 150g may have a configuration substantially the same as that of the second magnet assembly 150b. The sixth magnet assembly 150f may have a configuration substantially the same as that of the third magnet assembly 150c. The fifth magnet assembly 150e may have a configuration substantially the same as that of the fourth magnet assembly 150d.

Figure 6:
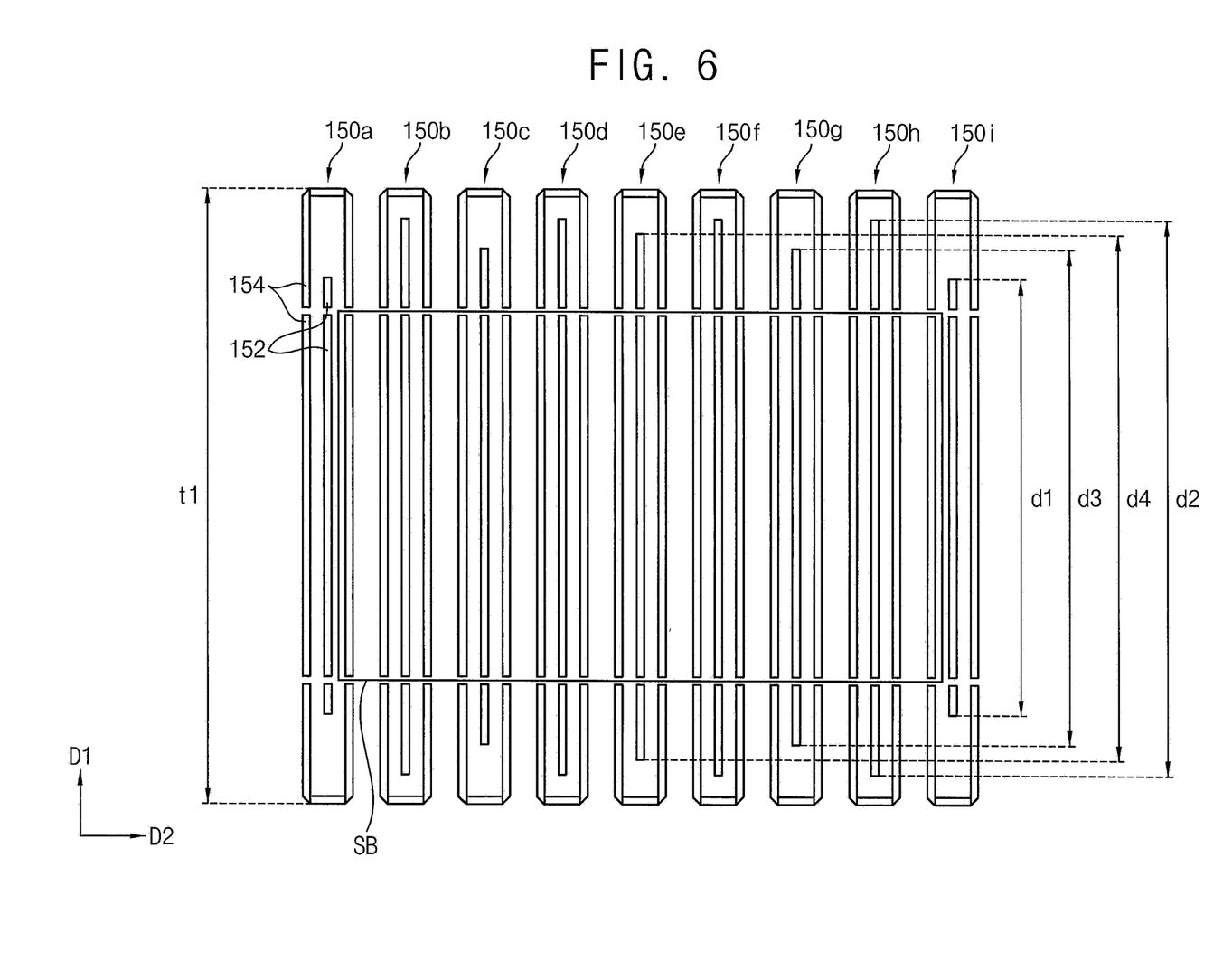
FIG. 6 is a plan view illustrating an arrangement of magnet assemblies of a depositing apparatus according to an exemplary embodiment of the present inventive concept.

FIG. 6 is a plan view illustrating an arrangement of magnet assemblies of a depositing apparatus according to an exemplary embodiment of the present inventive concept.

Referring to FIG. 6, the deposition apparatus is substantially the same as the deposition apparatus of FIG. 5, except that the deposition apparatus of FIG. 6 includes nine magnet assemblies instead of eight magnet assemblies. Therefore, repeated description may be omitted.

The magnet assemblies may include a first magnet assembly 150s, a second magnet assembly 150b, a third magnet assembly 150c, a fourth magnet assembly 150d, a fifth magnet assembly 150e, a sixth magnet assembly 150f, a seventh magnet assembly 150g, an eighth magnet assembly 150h, and a ninth magnet assembly 150i.

First magnets of the first magnet assembly 150s and the ninth magnet assembly 150i may each have a first length d1. First magnets of the second magnet assembly 150b, the fourth magnet assembly 150d, the sixth magnet assembly 150f, and the eighth magnet assembly 150h may each have a second length s2 greater than the first length d1. First magnets of the third magnet assembly 150c and the seventh magnet assembly 150g may each have a third length d3 which is greater than the first length d1 and smaller than the second length d2. First magnet of the fifth magnet assembly 150e may have a fourth length d4 greater than a third length d3 and smaller than the second length d2. Accordingly, the lengths of the first magnets of two adjacent magnet assemblies of the magnet assemblies of the deposition apparatus may be different from each other.

Figure 7:
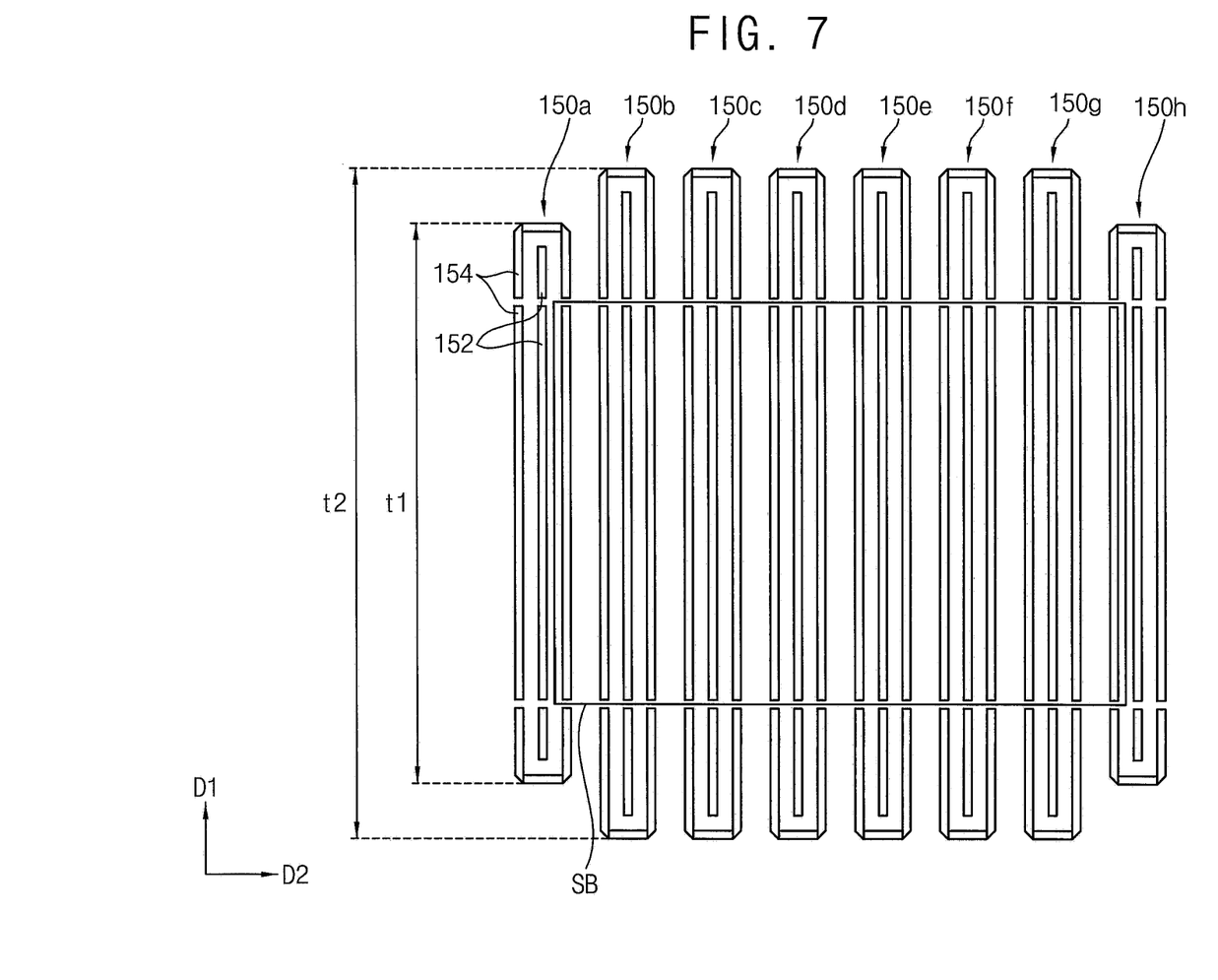
FIG. 7 is a plan view illustrating an arrangement of magnet assemblies according to an exemplary embodiment of the present inventive concept.

FIG. 7 is a plan view illustrating an arrangement of magnet assemblies according to an exemplary embodiment of the present inventive concept.

Referring to FIG. 7, the deposition apparatus may be substantially the same as the deposition apparatus of FIGS. 1 to 3 except for first and eighth magnet assemblies. Therefore, repeated description may be omitted.

The magnet assemblies may include a first magnet assembly 150a, a second magnet assembly 150b, a third magnet assembly 150c, a fourth magnet assembly 150d, a fifth magnet assembly 150e, a sixth magnet assembly 150f, a seventh magnet assembly 150g, and an eighth magnet assembly 150h.

The first magnet assembly 150a may include a first magnet extending in a first direction D1 and having a first length, and a second magnet disposed to at least partially surround the first magnet.

The second magnet assembly 150b may be spaced apart from the first magnet assembly 150a in a second direction D2 perpendicular to the first direction D1, and may include a first magnet extending in the first direction D1 and having a second length greater than the first length and a second magnet at least partially surrounding the first magnet.

A length t1 of the second magnet of the first magnet assembly 150a in the first direction D1 may be smaller than a length t2 of the second magnet of the second magnet assembly 150b in the first direction D1. The first magnet assembly 150a may be disposed to overlap an edge of the substrate SB extending in the first direction D1.

Here, since the length of the first magnet and the second magnet of the first magnet assembly 150a is formed shorter than that of the adjacent magnet assembly (e.g., the second magnet assembly 150b), the magnetic field may be weaker than that of other magnet assemblies. However, since an edge (e.g., up and down direction in the drawing) of the first magnet assembly 150a in the first direction D1 is disposed to not overlap the substrate SB, an effect of the magnetic field unevenness at the edge of the first magnet assembly 150a may be less. Thus, imbalance erosion of the target due to overlapping of plasma racetrack can be reduced.

In an exemplary embodiment of the present inventive concept, the deposition apparatus has been described as including eight or nine magnet assemblies, but the present inventive concept is not limited thereto. For example, a deposition apparatus may include a number of magnet assemblies that may be less than eight or greater nine, and length of the first magnets of the magnet assemblies disposed at the left and right ends of the arrangement of magnet assemblies may have smaller lengths smaller than that of the first magnets of the magnet assemblies disposed in the middle of the arrangement of the magnet assemblies.

Figure 8:
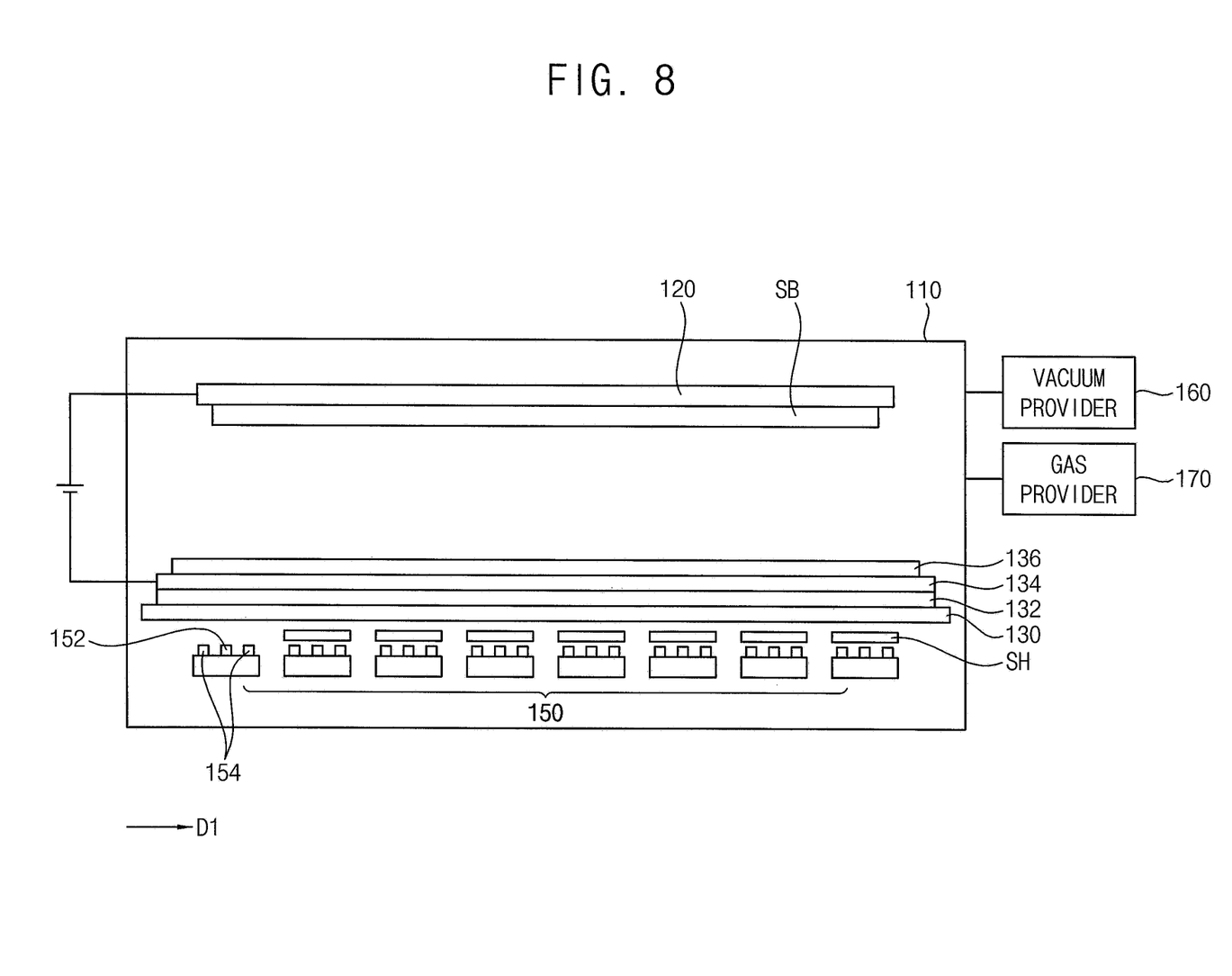
FIG. 8 is a schematic side view illustrating a deposition apparatus according to an exemplary embodiment of the present inventive concept.
Figure 9:
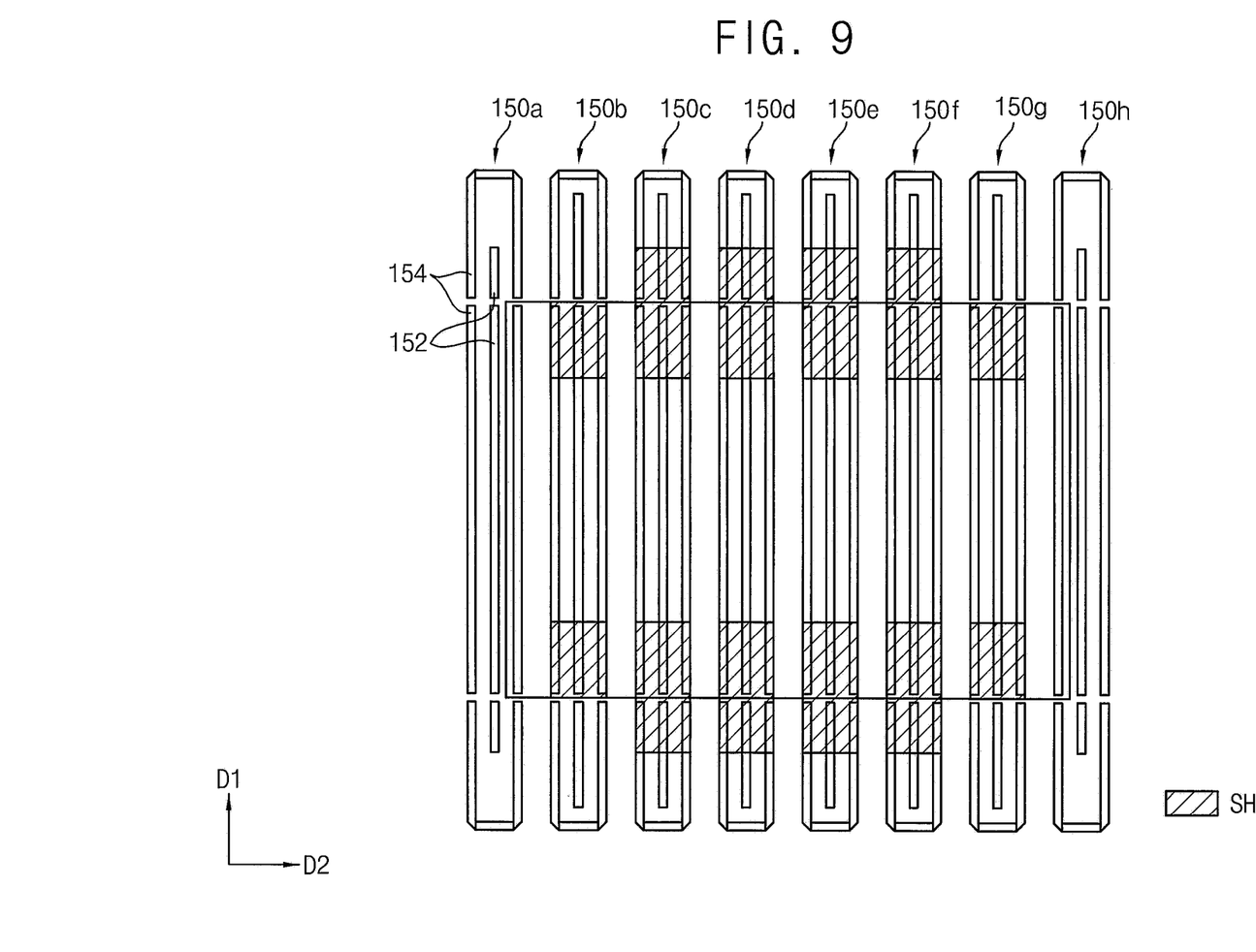
FIG. 9 is a plan view illustrating an arrangement of magnet assemblies of the deposition apparatus of FIG. 8.

FIG. 8 is a schematic side view illustrating a deposition apparatus according to an exemplary embodiment of the present inventive concept. FIG. 9 is a plan view illustrating an arrangement of magnet assemblies of the deposition apparatus of FIG. 8.

FIGS. 8 and 9, the deposition apparatus is substantially the same as the deposition apparatus of FIGS. 1 to 3 except that the deposition apparatus of FIGS. 8 and 9 further includes a shunt SH. Therefore, repeated description may be omitted.

The shunt SH may include a material which is disposed between a portion of the magnet assembly 150 and the target 136 and weakens the strength of the magnetic field. For example, the shunt SH may be made of a ferromagnetic material, such as stainless steel to have a spin direction opposite to that of the magnet assembly 150 to weaken the strength of the magnetic field around the shunt SH. Therefore, it is possible to prevent an increase in a deposition rate of a thin film in a specific region.

The shunt SH may be disposed in response to an erosion of the target 136. For example, the shunt SH may be disposed in the deposition apparatus such that it overlaps the edge of the substrate SB (See, e.g., FIG. 9)

According to the present embodiment, the deposition apparatus includes a substrate supporter for fixing a substrate, a target facing the substrate, and a plurality of magnet assemblies disposed below the target and each of which includes a first magnet extending in a first direction and a second magnet surrounding the first magnet. The second magnets of the plurality of magnet assemblies have the same length in the first direction, and the first magnets of the at least two magnet assemblies are formed to have different lengths. Therefore, non-uniform erosion of the target due to overlap of the plasma racetrack formed by the magnet assemblies at the edge of the substrate can be minimized. Accordingly, the efficiency of the target can be increased, and the process efficiency of the deposition process can be increased.

The present inventive concept can be applied to manufacturing an organic light emitting display devices and various electronic devices including the same. For example, the present inventive concept can be applied to manufacturing a mobile phone, a smart phone, a video phone, a smart pad, a smart watch, a tablet PC, a car navigation system, a television, a computer monitor, a notebook, and the like.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A deposition apparatus, comprising:
   a substrate supporter, wherein a substrate is fixed to the substrate supporter;
   a target facing the substrate;
   a first magnet assembly disposed below the target and including a first magnet extending in a first direction and having a first length, and a second magnet at least partially surrounding the first magnet; and
   a second magnet assembly disposed below the target and spaced apart from the first magnet assembly in a second direction which is substantially perpendicular to the first direction, and including a first magnet extending in the first direction and having a second length greater than the first length, and a second magnet at least partially surrounding the first magnet, and
   wherein the second magnet of the first magnet assembly and the second magnet of the second magnet assembly have substantially the same length as each other in the first direction,
   further comprising:
   a third magnet assembly spaced apart from the second magnet assembly in the second direction, and including a first magnet extending in the first direction, and a second magnet at least partially surrounding the first magnet,
   wherein the second magnet of the first magnet assembly and the second magnet of the third magnet assembly have substantially the same length in the first direction,
   wherein the first magnet of the third magnet assembly has a third length greater than the first length and smaller than the second length.

2. The deposition apparatus of claim 1, wherein the first and second magnet assemblies reciprocate along the second direction.

3. The deposition apparatus of claim 1, wherein the second magnet of the first magnet assembly and the second magnet of the second magnet assembly each have a rectangular shape.

4. The deposition apparatus of claim 1, wherein the first and second magnets of the first and second magnet assemblies each include a plurality of magnet blocks.

5. The deposition apparatus of claim 4, wherein a number of magnet blocks of the first magnet of the second magnet assembly is greater than a number of magnet blocks of the first magnet of the first magnet assembly.

6. The deposition apparatus of claim 1, further comprising:
   a plurality of magnet assemblies spaced apart from the second magnet assembly in the second direction, wherein each of the magnet assemblies includes a first magnet and a second magnet at least partially surrounding the first magnet, wherein the plurality of magnet assemblies includes the first magnet assembly and the second magnet assembly, and
   wherein an arrangement of the magnet assemblies is symmetrical with respect to a lie extending in the second direction.

7. The deposition apparatus of claim 6, wherein a number of the magnet assemblies is odd,
lengths in the first direction of the second magnets of the magnet assemblies are all the same as one another, and
lengths of the first magnets of two adjacent magnet assemblies are different from each other.

8. The deposition apparatus of claim 1, further comprising a shunt disposed between a portion of the second magnet assembly and the target, and including a ferromagnetic material.

9. The deposition apparatus of claim 8, wherein the shunt is arranged to overlap an edge of the substrate.

10. The deposition apparatus of claim 1, further comprising:
a chamber to accommodate the substrate supporter and the target;
a vacuum generator to provide a vacuum to the chamber; and
a gas generator to provide a process gas into the chamber.

11. The deposition apparatus of claim 10, further comprising:
a backing plate to fix the target;
a cavity plate disposed below the backing plate to fix the backing plate and fixed to the chamber; and
a non-stick layer disposed between the cavity plate and the backing plate.

12. The deposition apparatus of claim 1, wherein a portion of the first magnet assembly is disposed to not overlap the substrate.

13. A deposition apparatus, comprising:
a substrate supporter, wherein a substrate is fixed to the substrate supporter;
a target facing the substrate;
a first magnet assembly disposed below the target and including a first magnet extending in a first direction and having a first length, and a second magnet at least partially, surrounding the first magnet; and
a second magnet assembly disposed below the target and spaced apart from the first magnet assembly in a second direction which is substantially perpendicular to the first direction, and including a first magnet extending in the first direction and having a second length greater than the first length, and a second magnet at least partially surrounding the first magnet,
wherein a length of the second magnet of the first magnet assembly in the first direction is smaller than a length of the second magnet of the second magnet assembly, and
a portion of the first magnet assembly does not overlap the substrate,
wherein a width of the substrate is less than the first length of the first magnet of the first magnet assembly, from a plan view, wherein the width of the substrate extends in the first direction,
wherein the first magnet of the first magnet assembly includes a plurality of openings.

14. The deposition apparatus of claim 13, further comprising:
a third magnet assembly spaced apart from the second magnet assembly in the second direction, and including a first magnet extending in the first direction, and a second magnet at least partially surrounding the first magnet,
wherein the second magnet of the first magnet assembly and the second magnet of the third magnet assembly have substantially the same length as each other in the first direction.

15. A deposition apparatus, comprising:
a substrate supporter, wherein a substrate is fixed to the substrate supporter;
a target facing the substrate; and
a plurality of magnet assemblies disposed under the target, wherein each of the plurality of magnet assemblies includes a first magnet extending in a first direction, and a second magnet at least partially surrounding the first magnet,
wherein the second magnets of the plurality of magnet assemblies have substantially the same length as each other in the first direction, and
the first magnets of at least two of the magnet assemblies have different lengths from each other,
wherein a first magnet of a first magnet assembly of the plurality of magnet assemblies does not overlap the substrate,
wherein the first magnet of the first magnet assembly includes a plurality of openings.

16. The deposition apparatus of claim 15, wherein an arrangement of the magnet assemblies is symmetrical with respect to a line extending in a second direction that is substantially perpendicular to the first direction.

17. The deposition apparatus of claim 16, wherein lengths of the first magnets of two immediately adjacent magnet assemblies are different from each other.

* * * * *